United States Patent
Lissotschenko

(10) Patent No.: US 6,985,506 B2
(45) Date of Patent: Jan. 10, 2006

(54) SEMICONDUCTOR LASER DEVICE, SEMICONDUCTOR LASER MODULE FOR ONE SUCH SEMICONDUCTOR LASER DEVICE AND A PROCESS FOR PRODUCING ONE SUCH SEMICONDUCTOR LASER DEVICE

(75) Inventor: Vitalij Lissotschenko, Fröndenberg (DE)

(73) Assignee: Hentze-Lissotschenko Patentverwaltungs GmbH & Co. KG, Norderfriedrichskoog (DE)

(*) Notice: Subject to any disclaimer, the term of this patent is extended or adjusted under 35 U.S.C. 154(b) by 0 days.

(21) Appl. No.: 10/337,407

(22) Filed: Jan. 7, 2003

(65) Prior Publication Data

US 2004/0258124 A1   Dec. 23, 2004

(30) Foreign Application Priority Data

Dec. 13, 2002  (DE) .................................. 102 58 745

(51) Int. Cl.
*H01S 5/00* (2006.01)

(52) U.S. Cl. ...................... 372/50; 372/34; 372/46; 372/101

(58) Field of Classification Search .......... 372/43–50, 372/101, 34–36, 108
See application file for complete search history.

(56) References Cited

U.S. PATENT DOCUMENTS

| 3,875,532 | A | | 4/1975 | Kobayashi et al. | .... 331/94.5 H |
| 5,068,865 | A | * | 11/1991 | Ohshima et al. | ............... 372/36 |
| 5,247,530 | A | * | 9/1993 | Shigeno et al. | ............... 372/36 |
| 5,420,722 | A | | 5/1995 | Bielak | ........................ 359/708 |
| 5,706,302 | A | * | 1/1998 | Shimizu | ........................ 372/36 |
| 5,757,830 | A | * | 5/1998 | Liau et al. | ........................ 372/36 |
| 5,793,792 | A | * | 8/1998 | Baxter et al. | ............... 372/107 |
| 5,974,065 | A | * | 10/1999 | Kanda | ............... 372/43 |
| 5,995,525 | A | * | 11/1999 | Kosugi | ........................ 372/36 |
| 6,101,202 | A | * | 8/2000 | Kosugi | ........................ 372/36 |
| 6,625,185 | B2 | * | 9/2003 | Ishimaru | ....................... 372/36 |
| 6,676,306 | B2 | * | 1/2004 | Ikeda et al. | ................... 385/92 |
| 6,721,341 | B2 | * | 4/2004 | Aikiyo et al. | ................. 372/36 |
| 6,810,049 | B2 | * | 10/2004 | Wakisaka et al. | ............. 372/36 |

FOREIGN PATENT DOCUMENTS

DE   44 18 477   11/1995
DE   100 42 904   8/2002

(Continued)

OTHER PUBLICATIONS

"Simple Compact Diode-Laser/Microlens Packaging" Z.L. Liau et al., IEEE Journal of Quantum Electronics, vol. 33, pps. 457-461.

*Primary Examiner*—Minsun Oh Harvey
*Assistant Examiner*—Delma R. Flores-Ruiz
(74) *Attorney, Agent, or Firm*—Hoffman, Wasson & Gitler, P.C.

(57) ABSTRACT

This invention relates to a semiconductor laser device including a semiconductor laser element with an exit surface from which laser radiation can emerge, a collimating lens means which can reduce the divergence of the laser radiation emerging from the exit surface at least with respect to the first direction (Y) which is essentially perpendicular to the exit direction (Z) of the laser radiation, the semiconductor laser device furthermore including an auxiliary body which is permanently connected both to the semiconductor laser element and also to the collimating lens means. Furthermore, this invention relates to a semiconductor laser module of a semiconductor laser element, an auxiliary body and a collimating lens means and a process for producing the semiconductor laser means.

18 Claims, 1 Drawing Sheet

FOREIGN PATENT DOCUMENTS

| | | |
|---|---|---|
| EP | 0 800 243 A2 | 10/1997 |
| EP | 0800 243 A3 | 7/1998 |
| JP | 02114687 | 4/1990 |
| JP | 4-63669 | 5/1992 |
| JP | 6196816 | 7/1994 |
| JP | 2002232068 | 8/2002 |
| JP | 2002329918 | 11/2002 |
| WO | WO 02/082164 A2 | 10/2002 |

\* cited by examiner

SEMICONDUCTOR LASER DEVICE, SEMICONDUCTOR LASER MODULE FOR ONE SUCH SEMICONDUCTOR LASER DEVICE AND A PROCESS FOR PRODUCING ONE SUCH SEMICONDUCTOR LASER DEVICE

BACKGROUND OF THE INVENTION

This invention relates to a semiconductor laser device including a semiconductor laser element with an exit surface from which laser radiation can emerge and a collimating lens means which can reduce the divergence of the laser radiation emerging from the exit surface at least with respect to the first direction, which is perpendicular to the exit direction of the laser radiation. Furthermore, this invention relates to a semiconductor laser module for one such semiconductor laser device and a process for producing one such semiconductor laser device.

International patent application WO 02/082164 A2 discloses a semiconductor laser device and a process of the aforementioned type. The semiconductor laser device includes a semiconductor laser element which can be soldered onto a heat sink. The semiconductor laser element described therein, is a so-called laser diode bar which has line emission surfaces which are located in one direction spaced apart from one another and which extend lengthwise in this direction. In front of the outlet surface of the semiconductor laser element, there is a collimating lens means which is made as a fast axis collimating lens, in the case of the laser diode bar. This fast axis collimating lens reduces the divergence of the laser radiation in the direction perpendicular to the direction in which the line emission surfaces are located next to one another. This direction is called the fast axis. The laser radiation which has been collimated in this way in the direction of the fast axis can be further collimated in the direction perpendicular thereto, the slow axis, and can be focused onto a glass fiber.

The fact that the heat sink is a large copper block, but the semiconductor laser element is a diode of gallium arsenide, is a problem in these semiconductor laser elements. Gallium arsenide and copper have distinctly different coefficients of thermal expansion. For this reason, the solder layer between the heat sink and the semiconductor laser element may not be made very thin, and may not be implemented at very high temperatures because in both cases thermally induced stress would occur which is so high that the semiconductor laser element could be damaged. The solder layer conventionally has a thickness of roughly 5 microns and is produced at temperatures between 180° C. and 200° C. It is therefore a comparatively soft solder layer. In particular, as a result of this soft solder layer, however also for example with alternative attachment methods such as screwing the semiconductor laser element onto the heat sink, bending of the semiconductor laser element can occur over the length of its emission surfaces or its exit surface. This bending is generally called "smile" distortion. Laser radiation with "smile" distortion which passes through a fast axis collimating lens is deflected up in the middle area in which the exit surface is shifted down relative to the outer areas in this middle area. In this way, in the art, laser radiation arises which emerges from the collimating lens means, which runs apart in the direction of the fast axis and which is thus difficult to further process. In the semiconductor laser devices, known from the art, this leads to large intensity losses of the laser radiation which emerges from the semiconductor laser device. In the aforementioned art, the attempt is made with comparatively complex means to compensate for this "smile" distortion. To do this, many different lens means are used which are tilted to one another and which are located next to one another.

The object of this invention is to devise a semiconductor laser device of the initially mentioned type in which these distortions can be avoided with simple means. Furthermore, a semiconductor laser module for one such semiconductor laser device will be devised. Furthermore, a process for producing one such semiconductor laser device will be given.

SUMMARY OF THE INVENTION

It is stipulated that the semiconductor laser device includes an auxiliary body which is permanently connected both to the semiconductor laser element and also to the collimating lens means. The resulting solid connection between the collimating lens means and the semiconductor laser element leads to the fact that when the semiconductor laser element is bent the collimating lens means is also bent at the same time. If the elongated line exit surface for laser radiation is cambered down in the middle, the collimating lens means is cambered down roughly to the same degree. In this way, the typical problems known from the art as a result of the "smile"-distorted laser radiation which has passed through an unbent collimating lens means do not occur.

The concomitant bending of the collimating lens means results in that the laser radiation emerging from the collimating lens means no longer runs apart in the direction of the fast axis. In this way, the laser radiation can be collimated much better in the slow axis direction and further focused. In this way, a much greater power density can be achieved with the semiconductor laser device as set forth in the invention.

The permanent connection between the semiconductor laser element and the auxiliary body is made as a first solder layer. Furthermore, the permanent connection between the auxiliary body and the collimating lens means can be made as a second solder layer. These solder layers can have a thickness between 0.05 microns and 1 micron, especially a thickness between 0.1 micron and 0.5 micron. Very strong connections between the semiconductor laser elements and the auxiliary body as well as the auxiliary body and the collimating lens means can be produced by such thin and solid solder layers. In this ways it can be ensured that when the semiconductor laser element bends the collimating lens means bends roughly to the same degree at the same time.

According to one preferred embodiment of this invention, it can be provided that the semiconductor laser element and the auxiliary body consist of essentially the same material. The semiconductor laser element and the auxiliary body can be made of gallium arsenide. Choosing the same material for the semiconductor laser element and the auxiliary body ensures that in the production of the aforementioned solder layer no problems as a result of the different coefficients of thermal expansion can occur. At roughly the same coefficient of thermal expansion thus a very thin, very solid solder layer can be produced.

The collimating lens means together with the carrier is made in one piece in a substrate, especially a glass substrate. Here the carrier can be connected permanently to the auxiliary body, via the second solder layer. Advantageously the collimating lens means and/or the carrier may be made of a material which has the same coefficient of thermal expansion as the auxiliary body. In this case, the collimating lens means and/or the carrier can be made of a material which has essentially the same coefficient of thermal expansion as gallium arsenide. Thus, in the production of the second solder layer, between the carrier and the auxiliary body no problems as a result of the different coefficients of thermal expansion arise. For example, for the substrate in which the carrier and the collimating lens means are made, a glass is used which has the same coefficient of thermal expansion as gallium arsenide.

The semiconductor laser device is made of a heat sink which is connected to the semiconductor laser element. The heat sink can be connected to the semiconductor laser element via a third solder layer, and this third solder layer can have a thickness of especially roughly 5 microns. This third solder layer can be made similarly to the solder layers from the art. Since, in this invention the collimating lens means for the fast axis is no longer connected directly to the heat sink, as is practiced to some extent in the art, but is connected permanently to the semiconductor laser element via the first and the second solder layer, no disadvantages arise due to the aforementioned thick soft solder layer between the semiconductor laser element and heat sink.

A semiconductor laser module as outlined in the invention includes a semiconductor laser element, a collimating lens means. One such semiconductor laser module can also be handled separately and can be connected to a heat sink by users on site. The semiconductor laser module represents the core of a semiconductor laser device and can make available intense laser radiation which is well collimated in the fast axis direction.

The process as outlined in the invention is characterized in that the semiconductor laser element, the auxiliary body and the collimating lens means are connected securely to the semiconductor laser module. In particular, the semiconductor laser element can be soldered to the auxiliary body and/or the auxiliary body can be soldered to the collimating lens means.

According to one preferred embodiment of this invention, the soldering of the semiconductor laser element and the auxiliary body and/or the auxiliary body and collimating lens means occurs at a temperature of roughly 400° C. At these temperatures very strong and nevertheless thin solder layers can be achieved. The comparatively high temperatures of 400° C. are nevertheless not a problem for the materials used, since it is especially provided that the coefficients of thermal expansion of the materials used are matched to one another.

Advantageously it is provided that in a further step of the process the semiconductor laser module is connected to a heat sink. Here the semiconductor laser module can be soldered to the heat sink, especially at a temperature between 180° C. and 200° C. As already mentioned, this can also take place without problems at the final customer of the semiconductor laser device as claimed in the invention or of the semiconductor laser module as claimed in the invention.

BRIEF DESCRIPTION OF THE DRAWINGS

Other features and advantages of this invention become clear using the following description of preferred embodiments with reference to the attached drawings.

DETAILED DESCRIPTION OF THE INVENTION

Figure 1:
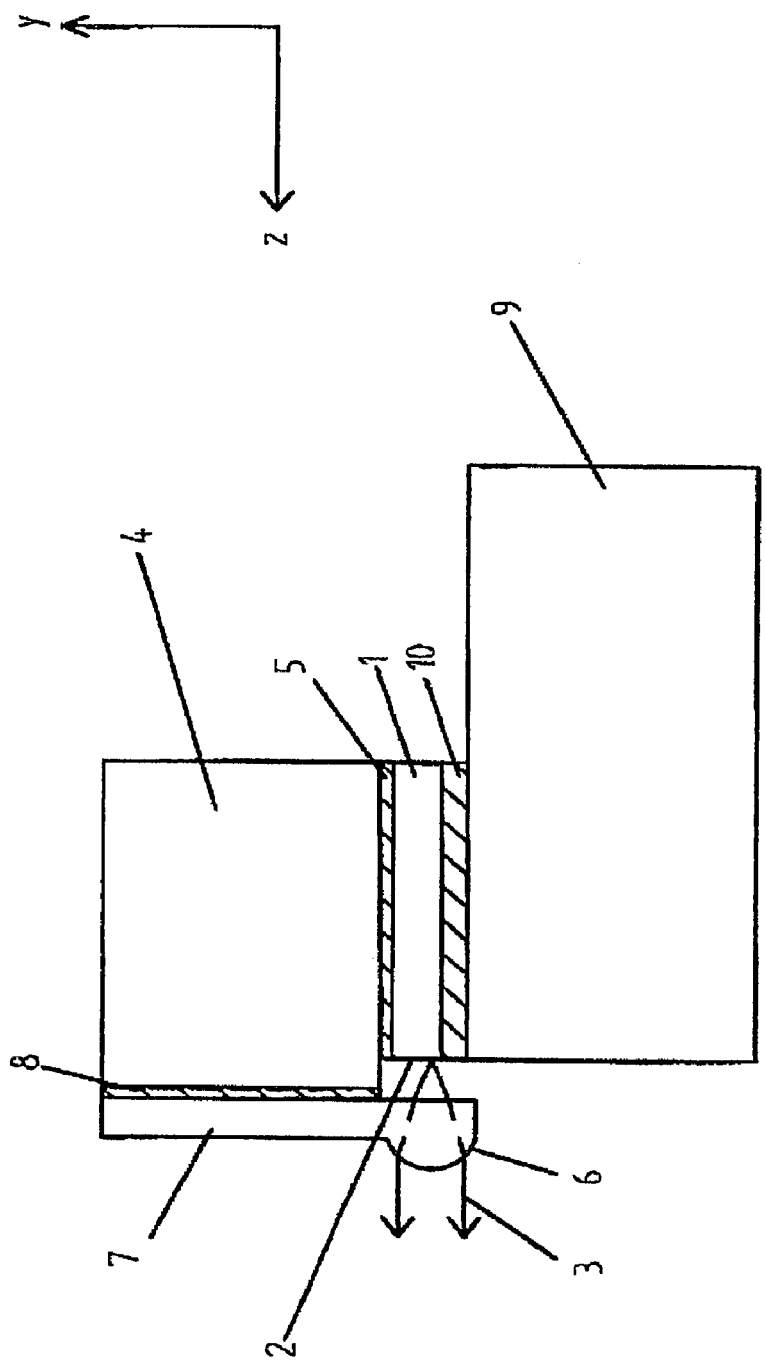
FIG. 1 shows a schematic side view of a semiconductor laser device as claimed in the invention.

FIG. 1 shows that a semiconductor laser device includes a semiconductor laser element 1 with an exit surface 2 from which laser radiation 3 can emerge. The semiconductor laser element 1 can be made especially as a semiconductor laser bar. One such semiconductor laser bar in the X direction (see the illustrated coordinate system) includes a series of line emission surfaces which are located next to one another, but spaced apart, these emission surfaces likewise extending essentially in the X direction. In the Y direction which is perpendicular thereto, the emission surfaces have a very small extension. For this reason the laser radiation 3 in the Y direction has a comparatively high divergence, so-called fast axis divergence.

The semiconductor laser device includes an auxiliary body, 4 which in the embodiment shown, is attached to the top of the semiconductor laser element 1, in particular is connected permanently to it. A solid connection between the semiconductor laser element 1 and the auxiliary body 4 can be achieved by a first solder layer 5. This first solder layer can be comparatively thin, between 0.1 micron and 0.5 micron thick. The first solder layer can be formed by soldering at a temperature of roughly 400° C.

The semiconductor laser element 1 and the auxiliary body 4 can consist of the same material. For example, both the semiconductor laser element 1 and also the auxiliary body 4 can consist of gallium arsenide. Based on the fact that both the semiconductor laser element 1 and also the auxiliary body 4 consist of the same material, thermal stresses do not occur on the components which have been joined to one another via the first solder layer 5 when the semiconductor laser element and the auxiliary body are heated or cooled. For this reason, the connection between the semiconductor laser element 1 and the auxiliary body 4 can be chosen to be very solid, especially as the aforementioned very thin and solid first solder layer 5.

As is apparent from FIG. 1, the semiconductor laser device furthermore comprises a collimating lens means 6 which forms an integral unit with the carrier 7 which is connected solidly to the auxiliary body 4. The collimating lens means 6 can be made as a fast axis collimating lens. In particular, the collimating lens means 6 can have a cylinder lens geometry with a cylinder axis in the X direction. The collimating lens means 6 can and the carrier 7 are made in a one-piece glass substrate.

As is apparent from FIG. 1, the auxiliary body 4 projects a distance in the Z direction beyond the exit surface 2. The surface of the auxiliary body 4 which is the face surface in the Z direction is parallel to the exit surface 2 and is offset a distance relative to it in the positive Z direction. The carrier 7 is solidly connected to this surface of the auxiliary body 4 for example by means of a second solder layer 8. This second solder layer can also be a solder layer which has been prepared at temperatures of roughly 400° C. with a thickness of for example 0.1 micron to 0.5 micron.

It is possible for the collimating lens means 6 to be produced with the integrated carrier 7 from glass which has the same coefficient of thermal expansion as the auxiliary body 4. In particular, the glass includes the collimating lens means 6 and the carrier 7 can thus have the same coefficient of thermal expansion as gallium arsenide.

FIG. 1 shows a heat sink 8 which is connected to the semiconductor laser element 1 via a third solder layer 10. The heat sink 9 can be produced from copper and is used, as is known from the art, for cooling the active later of the semiconductor laser element 1. This active layer is, as is apparent from FIG. 1, located comparatively far underneath in the semiconductor laser element 1 so that it can be effectively cooled by the heat sink 9. The third solder layer 10 between the heat sink 9 and the semiconductor laser element 1, as is also known from the art, is made as a comparatively soft solder layer. These soft solder layers are soldered roughly at temperatures between 180° C. and 200° C. Furthermore, the third solder layer between the heat sink 9 and the semiconductor laser element 1 is comparatively thick, for example roughly 5 microns thick.

FIG. 1 furthermore shows that the laser radiation 3 which emerges from the semiconductor laser element 1 is collimated by the collimating lens means 6 with respect to the Y direction. It is quite possible to place in the positive Z direction other collimating means for collimation with respect to the X axis, especially so-called slow axis collimating lenses, on the semiconductor laser device as.

As a result of the solid connection between the semiconductor laser element 1 and the collimating means 6, during temperature changes and the resulting for example bending of the semiconductor laser element 1, the collimating lens means 6 is bent to the same degree at the same time so that possible distortions of the laser beams, such as the known "smile" distortion, do not occur.

In the process, for producing a semiconductor laser device, first a semiconductor laser module is formed which includes the semiconductor laser element 1, the auxiliary body 4 and the collimating lens means 6 with the integrated carrier 7. This semiconductor laser module can be prepared by soldering the auxiliary body 4 to the semiconductor laser element 1 in the first working step. In the second working step, the carrier 7 is soldered onto the auxiliary body 4, and with the semiconductor laser element 1 turned on, the exact positioning of the collimating lens means 6 in front of the semiconductor laser element 1 can be checked using the laser radiation 3 emerging from the collimating lens means 6.

The semiconductor laser module produced in this manner can be soldered onto the heat sink 9 in another process step. The semiconductor laser module can also be handled especially separately.

What is claimed is:

1. A semiconductor laser device comprising:
   a semiconductor laser element with an exit surface from which laser radiation can emerge; and
   a collimating lens means which can reduce the divergence of the laser radiation emerging from the exit surface at least with respect to the first direction (Y) which is essentially perpendicular to the exit direction (Z) of the laser radiation;
   wherein the semiconductor laser device comprises an auxiliary body which is permanently connected both to the semiconductor laser element and also to the collimating lens means,
   wherein the semiconductor laser element, collimating lens means and the auxiliary body have the same coefficient of thermal expansion.

2. The semiconductor laser device as claimed in claim 1, wherein the permanent connection between the semiconductor laser element and the auxiliary body is made as a first solder layer.

3. The semiconductor laser device as claimed in claim 1, wherein the permanent connection between the auxiliary body and the collimating lens means is made as a second solder layer.

4. The semiconductor laser device as claimed in claim 2, wherein said first solder layer has a thickness between 0.05 microns and 1 micron.

5. The semiconductor laser device as claimed in claim 3, wherein said second solder layer has a thickness between 0.05 microns and 1 micron.

6. A semiconductor laser device comprising:
   a semiconductor laser element with an exit surface from which laser radiation can emerge; and
   a collimating lens means which can reduce the divergence of the laser radiation emerging from the exit surface at least with respect to the first direction (Y) which is essentially perpendicular to the exit direction (Z) of the laser radiation;
   wherein the semiconductor laser device comprises an auxiliary body which is permanently connected both to the semiconductor laser element and also to the collimating lens means, wherein the semiconductor laser element and the auxiliary body comprise the same material.

7. The semiconductor laser device as claimed in claim 6, wherein the semiconductor laser element and the auxiliary body comprises gallium arsenide.

8. A semiconductor laser device comprising:
   a semiconductor laser element with an exit surface from which laser radiation can emerge; and
   a collimating lens means which can reduce the divergence of the laser radiation emerging from the exit surface at least with respect to the first direction (Y) which is essentially perpendicular to the exit direction (Z) of the laser radiation;
   wherein the semiconductor laser device comprises an auxiliary body which is permanently connected both to the semiconductor laser element and also to the collimating lens means, wherein the collimating lens means together with a carrier is made in one piece in a glass substrate.

9. The semiconductor laser device as claimed in claim 8, wherein the carrier is connected permanently to the auxiliary body, via a solder layer.

10. The semiconductor laser device as claimed in claim 1, wherein a carrier of the collimating lens means has the same coefficient of thermal expansion as the auxiliary body.

11. The semiconductor laser device as claimed in claim 10, wherein the collimating lens means and the carrier comprise a material which has the same coefficient of thermal expansion as gallium arsenide.

12. The semiconductor laser device as claimed in claim 1, further comprising a heat sink which is connected to the semiconductor laser element.

13. The semiconductor laser device as claimed in claim 12, wherein the heat sink is connected to the semiconductor laser element via a third solder layer, and the third solder layer can have a thickness of approximately 5 microns.

14. The semiconductor laser device as claimed in claim 1, wherein the semiconductor laser element, the auxiliary body and the collimating lens means are permanently joined into a semiconductor laser module.

15. The semiconductor laser device as claimed in claim 14, wherein the semiconductor laser element is soldered to the auxiliary body and the auxiliary body is soldered to the collimating lens means.

16. The semiconductor laser device as claimed in claim 15, wherein the soldering of the semiconductor laser element and the auxiliary body and the auxiliary body and the collimating lens means occurs at a temperature of roughly 400° C.

17. The semiconductor laser device as claimed in claim 14, wherein in a further step a semiconductor laser module is connected to a heat sink.

18. The semiconductor laser device as claimed in claim 17, wherein the semiconductor laser module is soldered to the heat sink, at a temperature between 180° C. and 200° C.

* * * * *